US007763506B2

United States Patent
Treu et al.

(10) Patent No.: US 7,763,506 B2
(45) Date of Patent: Jul. 27, 2010

(54) METHOD FOR MAKING AN INTEGRATED CIRCUIT INCLUDING VERTICAL JUNCTION FIELD EFFECT TRANSISTORS

(75) Inventors: Michael Treu, Villach (AT); Roland Rupp, Lauf (DE); Heinz Mitlehner, Uttenreuth (DE); Rudolf Elpelt, Erlangen (DE); Peter Friedrichs, Nuremberg (DE); Larissa Wehrhahn-Kilian, Erlangen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/852,853

(22) Filed: Sep. 10, 2007

(65) Prior Publication Data

US 2009/0068803 A1    Mar. 12, 2009

(51) Int. Cl.
*H01L 21/337* (2006.01)
(52) U.S. Cl. .............................. 438/192; 257/E21.447
(58) Field of Classification Search ................ 438/192; 257/E21.447
See application file for complete search history.

(56) References Cited

U.S. PATENT DOCUMENTS

| 5,705,830 | A | 1/1998 | Siergiej et al. |
| 6,693,322 | B2 | 2/2004 | Friedrichs et al. |
| 6,870,189 | B1 * | 3/2005 | Harada et al. ............... 257/77 |
| 2004/0232450 | A1 * | 11/2004 | Yilmaz ..................... 257/213 |
| 2005/0012143 | A1 * | 1/2005 | Tanaka et al. ............. 257/328 |
| 2006/0113593 | A1 | 6/2006 | Sankin et al. |

FOREIGN PATENT DOCUMENTS

| DE | 102005046706 | 7/2007 |
| JP | 2006-190807 | 7/2006 |
| WO | 0209195 | 1/2002 |

* cited by examiner

*Primary Examiner*—Matthew Smith
*Assistant Examiner*—Walter H Swanson
(74) *Attorney, Agent, or Firm*—Dicke, Billig & Czaja, PLLC

(57) ABSTRACT

A method for making an integrated circuit including vertical junction field effect transistors is disclosed. One embodiment creates a vertical junction field effect transistor using a fault-tolerant or alignment-tolerant production process. The device performance is not harmed, even if misalignments in consecutive semiconductor processing steps occur.

14 Claims, 9 Drawing Sheets

US 7,763,506 B2

METHOD FOR MAKING AN INTEGRATED CIRCUIT INCLUDING VERTICAL JUNCTION FIELD EFFECT TRANSISTORS

BACKGROUND

The present invention relates to methods to make integrated circuits including VJFET (vertical junction field effect transistor)-structures and to methods that allow to efficiently integrate a body-diode within the transistor-structure.

A vertical JFET includes a drift-layer, which has to stand the blocking voltage in case the JFET is in its non-conducting off-state. Typically, a JFET includes a steering structure, in which a vertical channel is created to transport the charge carriers when the device is in an on-state (mostly, the channel is an n-channel in between two p-areas located on either side of the channel). When high voltages or currents are to be switched, SiC (silicon carbide) is often used as JFET substrate, as this material has superior properties allowing it to withstand high electric fields without electrical breakdown. Often, frequency converters or voltage changers, which may be implemented using a JFET as current-switching device, require a free wheeling diode to transport the current in a free wheeling state of the JFET, i.e. when the source and drain contacts of the JFET are operated with inverse polarities. In frequency converter or voltage changer applications, it is beneficial to integrate the free wheeling diode into the switching device (e.g., the JFET) itself as a body-diode, such that no external free wheeling diode circuitry is required.

This is particularly of interest, when the diode is robust enough to stand the highest possible currents, such that no external free wheeling circuitry is required at all. This significantly increases the reliability of the system, saves semiconductor area and does furthermore decrease the physical size of the converter resulting in reduced costs. However, to provide for these benefits, the diode has to be placed in the load circuit (i.e. it has to be connected to the source of a JFET) and not in the gate-circuitry. Naturally, a source-contact of a current-switching JFET-structure should have a large area, such as to allow for high currents. Furthermore, the fabrications methods used to provide those JFETs must use technologies or should be designed such as to allow a rather high alignment tolerance, to not harm the electrical performance of the devices or JFETs produced when small, unavoidable misalignment of subsequent production processes does occur. In case such appropriate production or fabrication methods are provided, the production yield can be furthermore increased, resulting in a further decrease of the overall production costs.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One or more embodiments provide fabrication methods or production methods to make an integrated circuit including a vertical junction field effect transistor having an integrated body-diode using fault-tolerant or alignment-tolerant production processes. One advantage of several embodiments is that the device performance is not harmed, even if small misalignments in consecutive semiconductor processing steps does occur.

It is another advantage of further embodiments, that the most relevant parameters of a JFET as, for example, channel length or channel width, can be provided with highest accuracy, although a integrated body-diode is provided, such that high-quality devices can be produced, which may be used in voltage converter application or the like without the need to additionally apply external free wheeling diode circuitry.

Referencing FIGS. 1-4, the following paragraphs will disclose integrated circuits including vertical junction field effect transistors and their geometries before discussing several embodiments, which allow to fabricate integrated circuits including VJFETs having an integrated body-diode without significantly increasing the production complexity or the costs of the ready produced VJFET device.

Figure 1A:
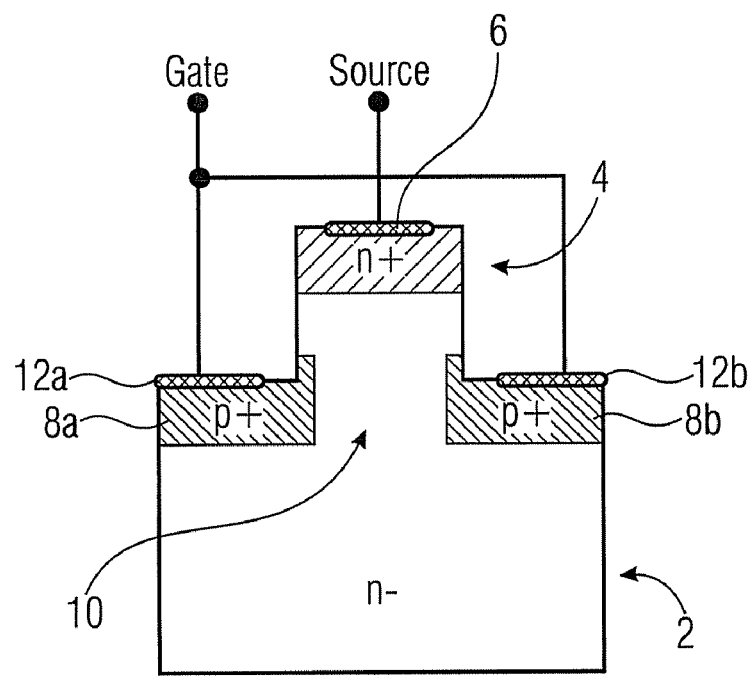
FIG. 1A illustrates an example for a vertical JFET without integrated body-diode.

A VJFET, as illustrated in FIG. 1A, typically includes a body-area 2 of a semiconductor material of a first conductivity type as, for example, n-doped material. A source-area 4 is contacted by a metallization 6, which contacts to a heavily doped n$^+$ region of the source-area 4. Two p$^+$ doped first and second areas 8a and 8b are located on either side of a channel region 10, which is formed underneath the source-area 4. Although not illustrated in FIG. 1A, a drain-contact would be provided at the bottom of the substrate when the JFET is completed, i.e. on a surface opposite to the source-metallization 6 (the source-region 4). As indicated in FIG. 1A, no p-n-transition blocks a vertical current path from source to drain and, therefore, the device can be designed to be self-conducting. That is, when no voltage is applied to the first and the second p$^+$-doped regions 8a and 8b via a gate-metallization 12a and 12b, the device will transport charge in its on-state. However, the device can also be designed to be normally off, as the conduction property depends on the presence of charge carriers along the channel region 10. When the channel becomes so small that the depletion zones caused by both areas 8a and 8b extend to each other, the device will become normally off.

In the normally on-configuration, a voltage applied to gate contacts 12a and 12b and, therefore, biasing pn-junction of the p$^+$-doped regions 8a and 8b in reverse direction, depletes the channel from charge carriers and current flow from source to drain is inhibited. The gate-voltage is typically within 10-30 volts, a voltage the source-gate diode must be able to block reliably. The isolation required is typically achieved by p$^+$-implantation at the borders of the N-channel and below the contacts of the gate-area, as indicated in FIG. 1A. The p$^+$ areas 8a and 8b are jointly contacted and the contact is provided at the ready device as a gate-terminal. As such, VJFET-devices are well suited to be used within frequency converters or voltage changers to serve as switches.

Figure 1B:
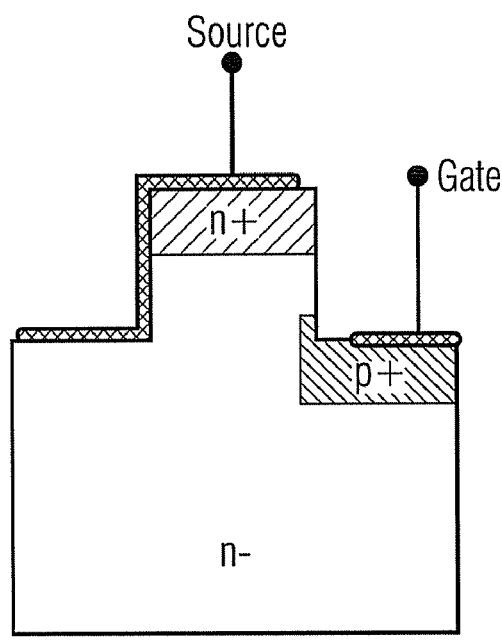
FIG. 1B illustrates an example of a vertical JFET with integrated Schottky-diode.

In some applications, further examples of VJFETs are used, in which the p$^+$-gate is only provided at one side of the channel. Such a configuration is illustrated in FIG. 1B. Only one p$^+$-area serving as a gate is present. At the other side of the channel, no p-implant is present and the source-metallization extends to the n-drift-area, i.e. to the body-region 2. Thus, a Schottky-diode is formed, which carries the current of the load circuit, when the VJFET is in a free wheeling state. However, the use of Schottky diodes suffers from high leakage currents. High local leakage currents are caused, as the metallization has to be applied on a pre-structured, non planarized surface.

Figure 2A:
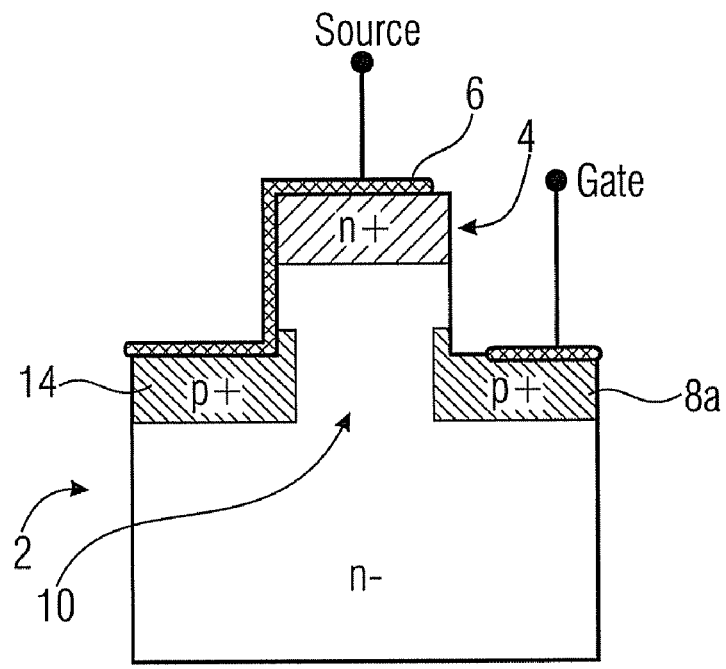
FIGS. 2A and 2B illustrate examples of VJFETs with integrated body-diodes.
Figure 2B:
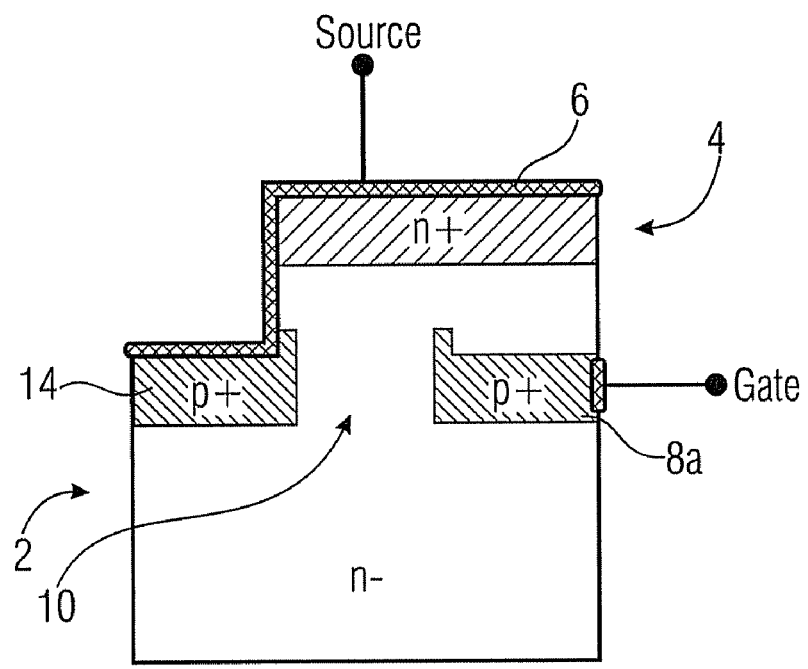

An alternate solution for integrated diodes is illustrated in FIGS. 2A and 2B, illustrating an integrated circuit including VJFETs similar to those of FIG. 1. Same or like components are, therefore, given the same reference numerals, wherein a repeated description of those components is omitted for the sake of conciseness.

As illustrated in FIGS. 2A and 2B, only one p$^+$-area 8a is connected to a gate-contact, wherein the second p$^+$-area 14 is short-circuited with the source-metallization 6 using a common metallization in the particular examples. According to FIG. 2A, the gate-area 8a can be directly connected within the cell or, as illustrated in FIG. 2B, be contacted at the border of a cell field of VJFET-cells. Generally, VJFET-cells are manufactured in larger arrays of 1 or more independent cells on a semiconductor substrate such as to increase the effective channel areas as much as possible to be able to switch high currents.

Figure 3A:
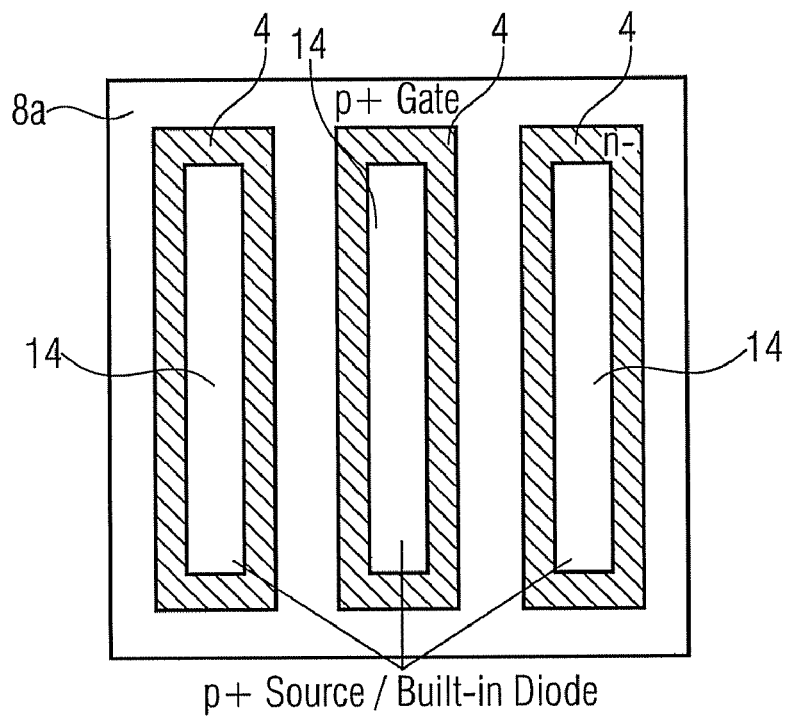
FIGS. 3A and 3B illustrate further examples of VJFET-geometries.
Figure 3B:
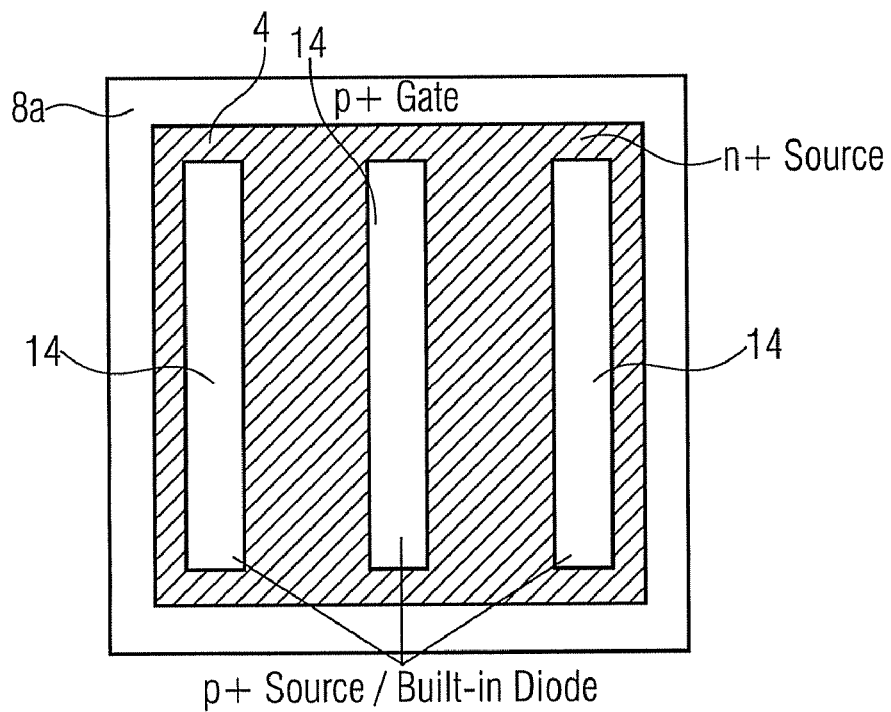

Possible 3-dimensional geometries for the cell fields are illustrated in FIGS. 3A and 3B. FIG. 3A relates to FIG. 2A and illustrates an integrated circuit including a face-on illustration of 6 elongated VJFETs-structures having the cross-section of FIG. 2A. FIG. 3B, instead, illustrates a phase-on illustration of a cell field based on individual cells having the cross-section indicated in FIG. 2B.

FIG. 3A illustrates a rectangular VJFET-structure based on the cell-structure of FIG. 2A. In the rectangular cell-arrangement of FIG. 3A, gate-area 8a forms a continuous area, which may be contacted using a metallization, a gate-pad or the like.

Rectangular source-areas 4 enclose the p$^+$-areas 14, which are short-circuited with the source-areas 4, thus forming the built-in PN-diode. A large-area source-contact can thus be realized, which, may cover nearly the whole chip-area, except for gate pads needed to contact to the gate-structures. According to some embodiments, a bending radius of the p$^+$-areas 14 with respect to the surface of the device is bigger than the bending radius of the gate-area 8a. This has one advantage that an avalanche-area is locally defined within each individual cell. Channel lengths are bigger or equal to 1 µm, to provide a pentode-like output characteristic of the device.

FIG. 3B illustrates a rectangular geometry of a VJFET-device based on the cell structure of FIG. 2B. The source-area 4 forms a continuous surface with embedded p$^+$-areas 14 of the built-in diodes. The gate-area 8a is provided at the surrounding of the device and can as such be connected to from the border of the structure. However, the device has to be designed such that the path length of the gate contacts to each channel region does not exceed a predetermined design limit. This is necessary to assure that a sufficiently high gate voltage can be applied at any channel region, such as to assure a reliably and fast switching device.

Figure 4A:
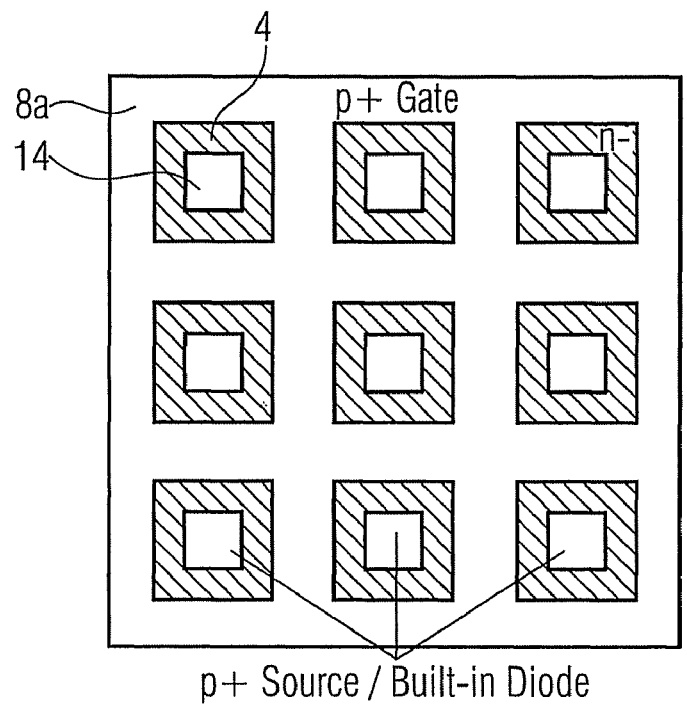
FIGS. 4A and 4B illustrate a further examples of VJFET-geometries.
Figure 4B:
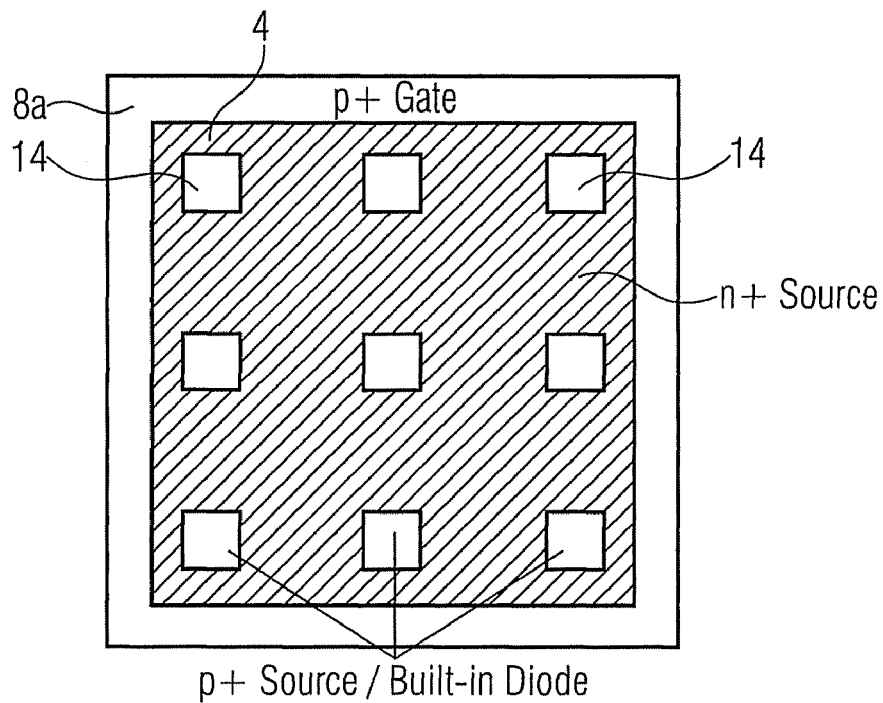

FIGS. 4A and 4B illustrate alternate embodiments which can be easily produced using the inventive methods to fabricate VJFETs.

In FIG. 4A, the cell structures of FIG. 2A are geometrically arranged to form rectangular cells, wherein within each rectangular cell, the source-area 4 surrounds the p$^+$-area 14 of the associated internal diode. The gate-area 8a forms a continuous surface and surrounds the rectangular cells of the VJFET-device. FIG. 4B illustrates a rectangular-geometry based on the cell structure of FIG. 2B. Consequently, the source-area 4 is a continuous surface, surrounding rectangular areas 14 of the built-in PN-diodes. The surrounding gate-structure 8a may be connected to from the side faces of the device.

In the following, embodiments will illustrate how the previously described VJFETs can be fabricated, using etching/implantation processes. That is, complex vertical junction field effect transistor-structures can be produced with utmost precision without the need to additionally implement complex and costly processes. This can be achieved when any of the methods described below is used.

In the following description, the term "main surface" will often be used to describe a direction, from which a specific production process is performed or a surface on which additional layers or dopants are provided. With respect to the main surface, it shall be understood that the main surface is a surface having a lateral extension which is greater than the thickness of the processed semiconductor material. In the most general terms, the main surface describes the surface, to which a process is applied. It is important to note, that the main surface does not necessarily have to be flat as, for example, implants may be performed also on previously structured surfaces.

Figure 5A:
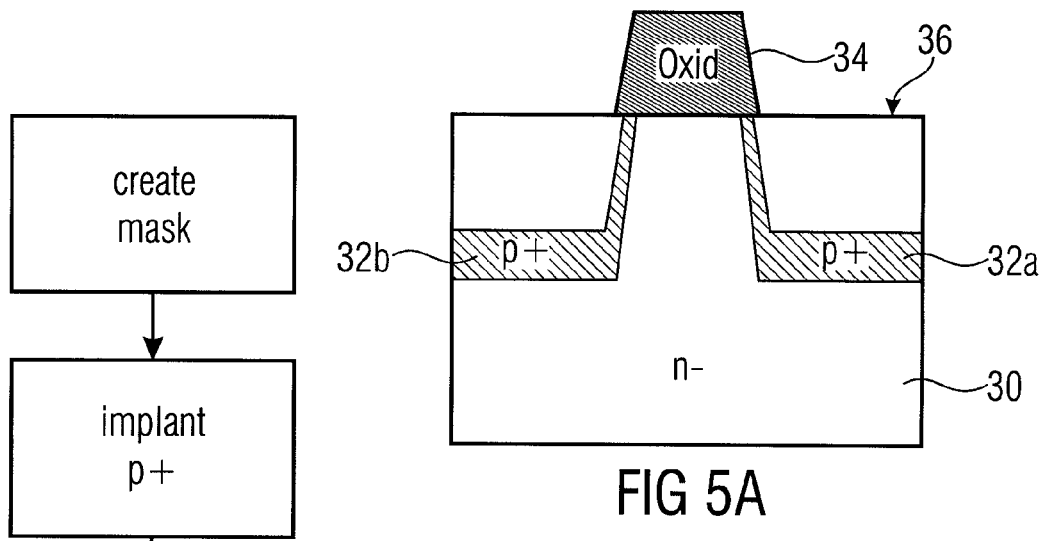
FIGS. 5A-5E illustrate an embodiment of a method for producing an integrated circuit including a VJFET.
Figure 5B:
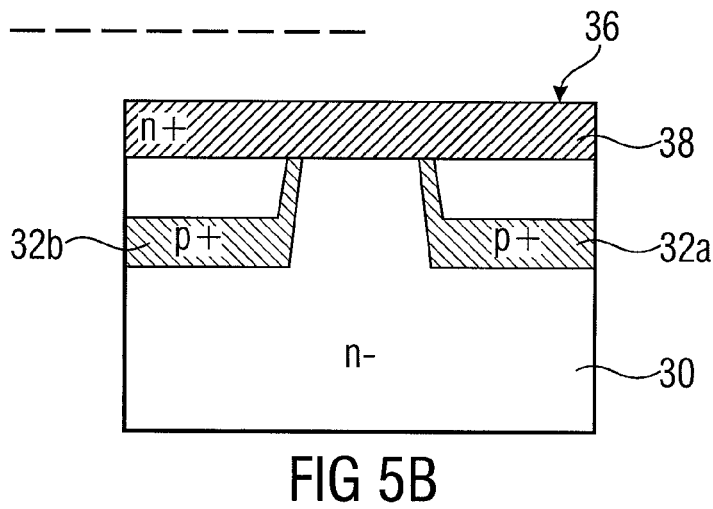
Figure 5C:
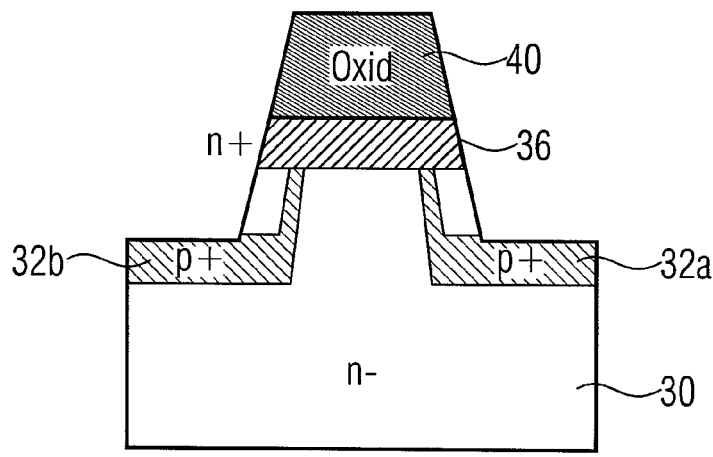

According to a first embodiment, an integrated circuit including vertical JFETs are produced using a method resulting in the intermediate semiconductor arrangements illustrated in FIGS. 5A-5C. FIGS. 5A-5C illustrate how intermediate semiconductor structures look like, when produced according to the associated method, which is illustrated by the accompanying block diagram.

The configuration of FIG. 5A, having an epitactic n-doped layer 30 (drift-zone) deeply implanted p$^+$-dopants 32a and 32b and a mask 34 of oxide might be created by the following processes. First, create a mask of predetermined width on a main surface 36 of the substrate 30, which is of a first conductivity type (for example n-doped as illustrated in FIG.

5A). After the creation of the mask 34, a second conductivity type material (p+) is implanted up to a predetermined depth into the main surface 36 of the semiconductor substrate. A dopant-profile, as indicated in FIG. 5A, can be created which extends to the main surface 36 due to the geometry of the mask 34. Furthermore, the mask of the predetermined width defines, with utmost precision, the width of the channel area in between the p+-regions 32a and 32b. As channel area and channel depth are the most important parameters for the design of a VJFET, proceeding as previously described is extremely beneficial, as the mask 34 can be produced with high precision and thus can the channel.

In other words, in an epitactic n-doped layer, p-areas are created by a deep p-implant over an oxide mask, which defines the lateral width of the resulting channel. By precisely adjusting the edges of the oxide (mask angle) 34, precisely defined p-areas can be created, which extend up to the main surface 36 of the device and which define the width and the height of the channel.

Generally, it is desirable to have a channel with constant cross section along the channel length, i.e. p-areas extending perpendicularly from the surface of the device. However, varying the mask angle of the Oxide mask (i.e. the angle of the walls of the oxide mask 34 with respect to the surface of the substrate) may serve to fine tune the shape of the p-areas extending to the main surface 36, specifically to achieve a significant dopant concentration underneath the edges of the mask. One advantageous choice for the mask angle, balancing both requirements is, for example, the interval of 70° to 110° with respect to the main surface. Values above 90° indicate the possible use of masks that narrow towards the main surface of the substrate, i.e. that have the shape of the mask 34 but that are rotated by 180°.

In the configuration of FIG. 5B, the mask 34 is removed and an additional highly doped n+-layer 38 is created on the main surface 36 of the device. This configuration can be arrived at by removing the mask and by creating a source layer 38 of semiconductor material of the first conductivity type on the main surface 36 of the substrate. With the configuration of FIG. 5B, the most important parts of the VJFET-device to be produced are generated by a simple, standard process. That is, a source-contact area (the heavily doped n+-area 38), a channel (defined by p+-areas 32a and 32b) and a drift-area 30 are present, which can be externally connected to provide a fully functional device.

According to another embodiment, the source-contact area is provided by an epitactical growth of semiconductor material of the first conductivity type to arrive at the configuration of FIG. 5B. The material may be grown with the required high dopant concentration, or the growth may be followed by a further implantation of a first conductivity type material.

As previously discussed, the general design goal of blocking the pinch-off voltage between the source-contact area 38 and the gate area 32a or 32b of the device can be achieved by appropriately designing the mask and the implantation energies/doses used in the process.

To contact the p+-areas 32a and 32b and to potentially form a built-in pn-diode, semiconductor material may be removed from the first and/or the second side of a further mask 40, which may be applied upon the main surface 36 of the semiconductor configuration of FIG. 5B. A possible misalignment in the creation of the mask 40 is of minor importance as, once the mask 40 is chosen wide enough, the channel is not harmed. As indicated in FIG. 5C, an optional short-circuiting of the second conduction type material 32a or 32b and the source layer 38 may include a removing of semiconductor material from the first or the second side of the mask 40 up to the second conduction type material and a subsequent deposition of conductive material on the source layer and on the first and/or second type conduction type material at the first or the second side of the mask 40.

If a built-in pn-diode is to be short-circuited with the source area, a two-dimensional mask (extending in one direction with the predetermined width) has to be created such on the surface of the substrate, that the areas on the left side and on the right side of the mask are physically separated from each other. This is an obvious demand, as the areas on the left and on the right sides have to be contacted without being short-circuited. Two possible 2-dimensional mask-layouts are illustrated previously by FIGS. 3A-4B.

A further design option to increase the device performance is to choose the predetermined width of the mask (defining the channel width) smaller than the predetermined depth, to which the second conductivity type material is implanted or to which it extends (which defines the channel length). Such, the channel length is greater than the channel width, allowing for a stable operation of the manufactured device.

Figure 5D:
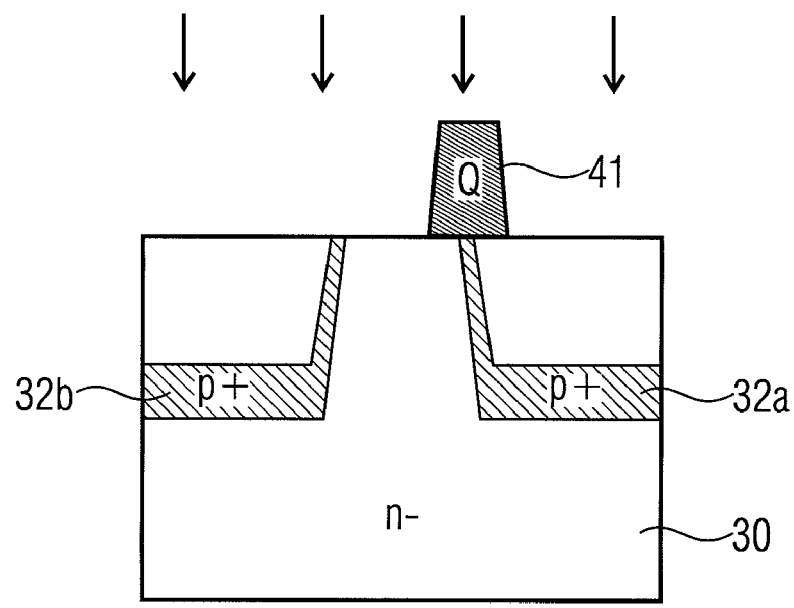
Figure 5E:
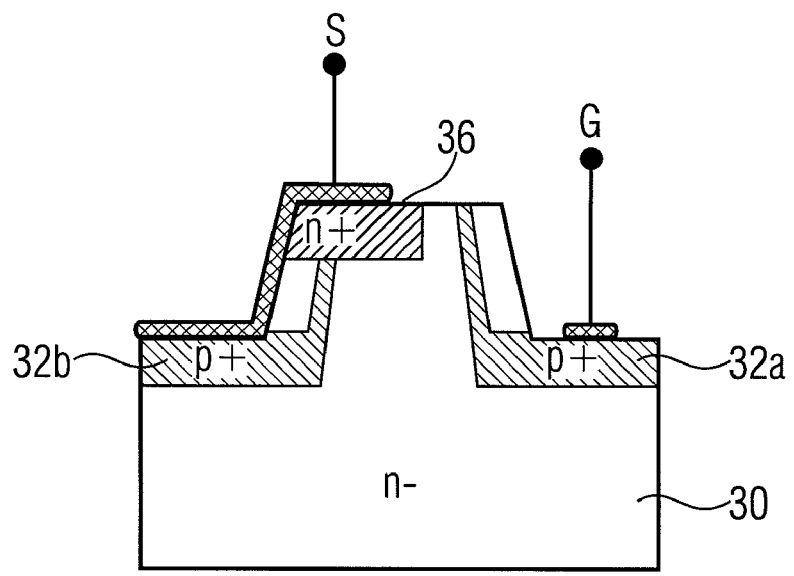

FIG. 5D illustrates a further intermediate configuration starting from the configuration of FIG. 5A, which may be seen as intermediate processes to arrive at the configuration of FIG. 5E, in which a source-area 38' does not laterally extend over the complete area covered by mask 34. This means a pn-junction between the higher doped source area 38 and the gate area 32a can be avoided, such as to increase the gate-source voltage blocking capability. To arrive at the configuration of FIG. 5E, an intermediate production process 5d may be performed, in which a source mask 41 is created on the main surface of the semiconductor substrate, wherein the source mask 41 does only partly cover the area of the removed mask 34. After the creation of the source mask, first conductivity type material is implanted into the main surface. Therefore, only part of the surface area between the p+-areas 32a and 32b (the latter channel area) is subjected to a source-implant 38'. By application of this additional intermediate production process, the gate-source voltage blocking capability can be significantly increased.

According to a further embodiment, the creation of the source layer may be performed by implanting semiconductor material of the first conduction type with different energies such that a dopant concentration is tailored to some specific predetermined dopant profile. In other words, by an n-implant of the whole surface and with varying energies (and hence implantation depths) as well as with varying dopants, the channel doping can be adjusted in view of the desired gate voltage and in view of the source-area to be contacted.

Further production processes may be required, to finally arrive at a functional device, such as for example a thermal treatment (thermal annealing with, e.g., temperatures between 1300° C. and 1800° C. and process times in between 1 min and 30 min) to activate the heavily doped source-contact area 38 and 38', respectively.

In particular, by creating a gradient of the implanted n-dopant, the gate-source pn-transition can be relaxed, such that the applied gate-voltage is blocked reliably. The contact to the p+-area can be provided by subsequent etching, wherein the mask of the etching is fault-tolerant, i.e. a precise alignment is not required such that even a possible misalignment does not render the device unusable. The gate-contacts and the associated isolation may be produced in two additional production processes. Finally, a large-area metallization may be used to connect the source and the diode short-circuited to the source.

A device produced according to the previously described method is characterized by a precisely manufactured channel due to the implantation using a mask and only planar, full area processes. That is, possible tilted implantations or focused implantations can be avoided, which would inevitably lead to undesirable parameter fluctuations. Furthermore, the etching to contact the p$^+$-areas is not critical with respect to the alignment, as previously described.

Figure 6A:
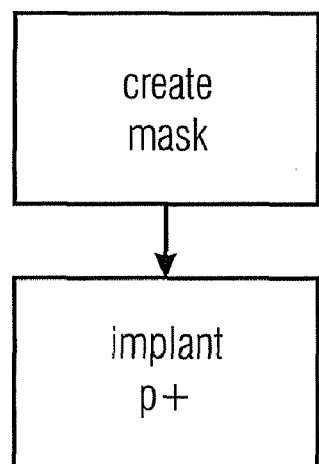
FIGS. 6A-6C illustrate a further embodiment of a method for producing an integrated circuit including a VJFET.
Figure 6A:
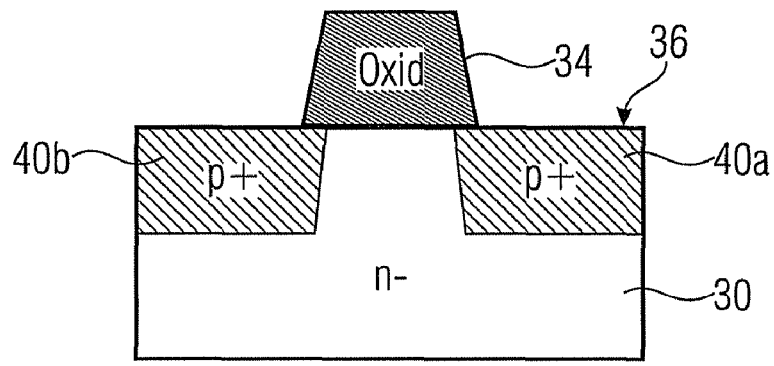
Figure 6B:
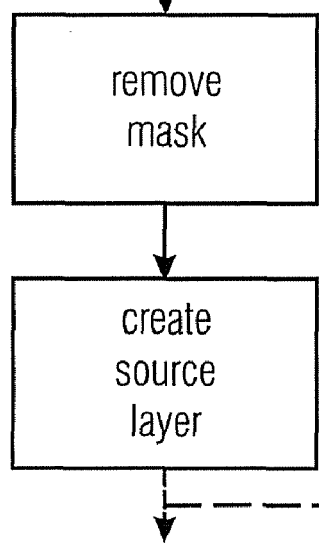
Figure 6B:
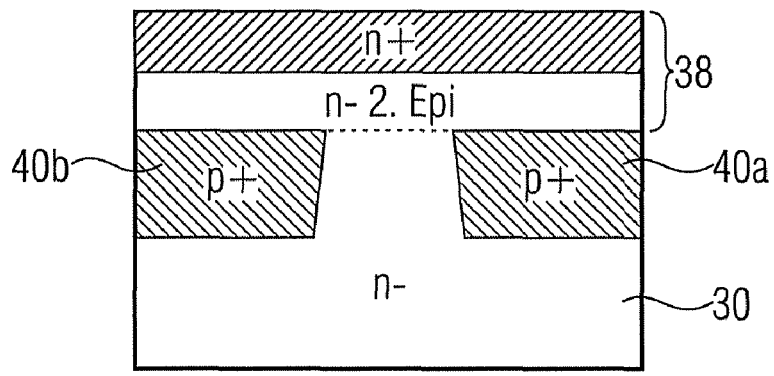
Figure 6C:
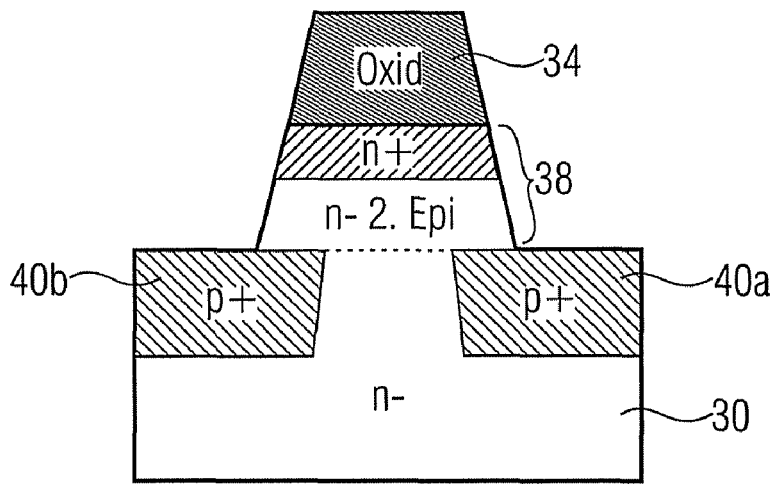

FIGS. 6A-6C and the associated block diagram of an embodiment of the method describe a further advantageous way to produce an integrated circuit including a vertical JFET. Starting from a doped n-substrate, the configuration of FIG. 6A, having a body-area 30, a mask 34 and a first and a second p$^+$-area 40a and 40b can be arrived at by creating a mask of a predetermined width on a main surface 36 of the doped semiconductor substrate. Then, a dopant of the second conductivity type material is implanted, up to a predetermined depth. As compared to the method proposed in FIG. 5A, the implanting energy is chosen such that a significant dopant concentration of the second conductivity type material (p-material) will be created on the main surface 36 of the substrate. As previously discussed, the channel width can be precisely defined by the width of the mask (oxid) 34.

After the removal of the mask, a source layer 38 of a semiconductor material of the first conductivity type (n) is created on the main surface 36 of the substrate. As illustrated in FIG. 6B, the source layer 38 is created by growing a semiconductor layer of the first conductivity type on top of the main surface 36 of the semiconductor structure of FIG. 6A. After the growing of the semiconductor layer, i.e. the creation of a second epitactic layer, an additional high-dose implant may be applied, to provide a highly-doped main surface of the semiconductor structure, which is necessary to provide for a low-loss metallization.

As illustrated in FIG. 6C, further production processes may be implemented to finally arrive at a fully functional device. This may, for example, include an etching of the previously grown semiconductor layer 38 on either side of the channel area, such as to electrically contact the p$^+$-areas. As with the previously described embodiment, this etching process is tolerant with respect to alignment errors, which inevitably occur when ever two independent masks are consecutively deposited on a wafer surface. Therefore, VJFETs can be produced, which have a precisely defined channel area, i.e. a precisely defined channel width and height. By short-cutting the second conductivity type material 40a or 40b with the source layer of the first conduction type 38, an integrated pn-diode can be created, capable of transporting a load current when the VJFET is switched off.

Summarizing, according to a further embodiment, which has been illustrated in FIGS. 6A-6C, a method for producing a vertical JFET is proposed, in which a masked p-implantation (for example, a deep implantation with a range of up to 2 μm) is performed directly on the surface of the drift-zone to define the vertical channel in its dimensions, i.e. to define the channel length and the channel width. Then, a second, thin n-epitactic layer (of width 0.2-1.0 μm) is created with consecutive n$^+$-(contact) implantation. This provides for the blocking capability of the gate-source diode. After an alignment-tolerant deep etching, the gate and source diodes can be contacted or short-circuited.

Figure 7A:
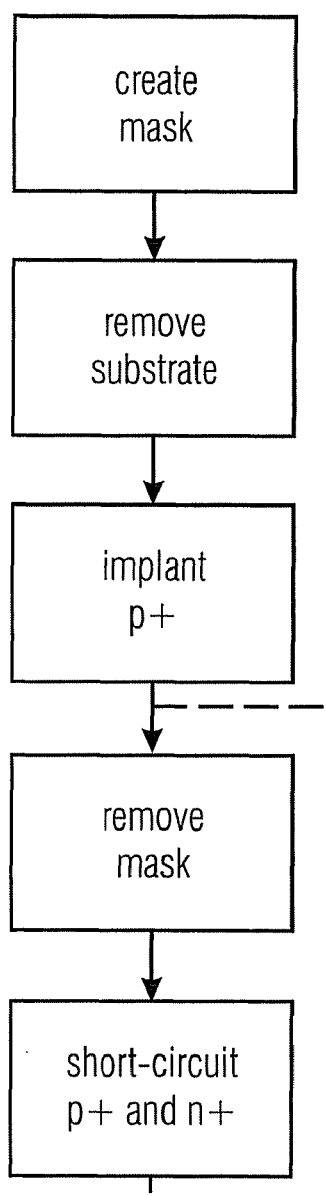
FIGS. 7A-7C illustrate a further embodiment of a method for producing an integrated circuit including a VJFET.
Figure 7A:
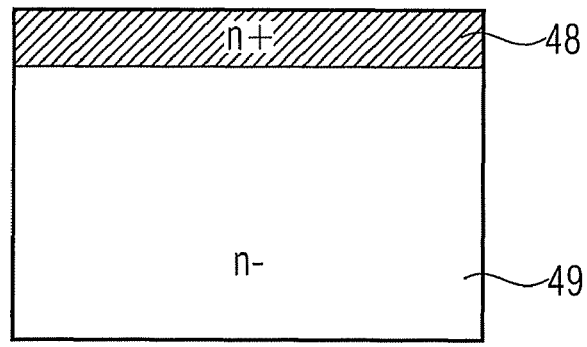
Figure 7B:
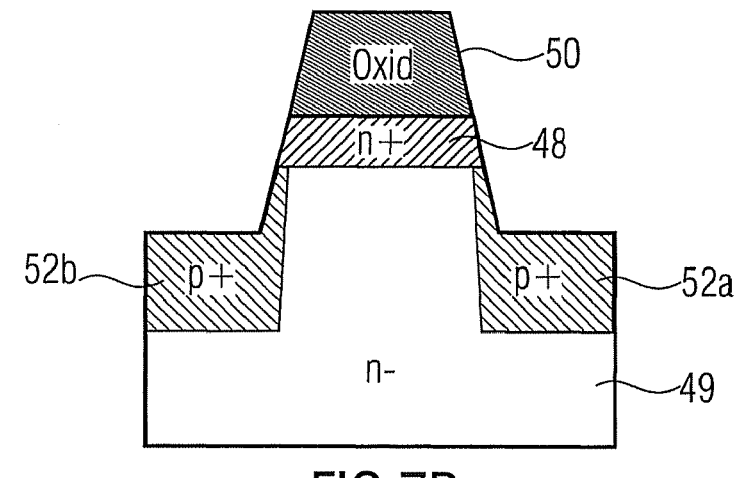

FIGS. 7A-7B illustrate a further embodiment, that is a further method for producing an integrated circuit including a vertical JFET. The method starts from a configuration illustrated in FIG. 7A where a highly doped n$^+$-layer 48 is already applied on top of an epitactically grown n$^-$-layer 49.

To arrive at the configuration of FIG. 7B, a mask is created with a predetermined width (defining the channel width) on a main surface of the semiconductor surface. Then, the substrate is removed on either side of the mask up to a predetermined depth. A p-implantation is performed to create p$^+$-doped areas on the first (52a) and the second (52b) side of the mask 50. The dopant concentrations of the n$^+$-layer and the p-implant are chosen such that the necessary gate-source voltage difference required for a channel pinch-off is blocked reliably by the created pn-junction between layers 48 and the p$^+$-doped area (in this particular example area 52a) which serves as gate contact area.

Figure 7C:
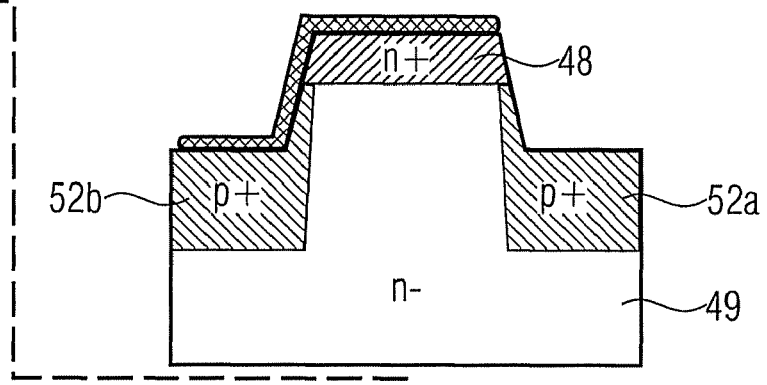

To arrive at the configuration of FIG. 7C, in which a pn-diode is created in the load circuit to transport charge in the off-state of the VJFET device, the second conduction type material 52b is short-circuited with the semiconductor material of the first conduction type forming the source-region 48. That is, the second conduction type material is short-circuited with the semiconductor material of the first conduction type at the position of the removed mask 50.

It goes without saying that, although not illustrated, all further necessary production processes will be performed to arrive at a fully functional VJFET-device such as, for example, applying isolating layers, providing gate contacts and so on and so forth.

The embodiment illustrated in FIGS. 7A-7C proposes a method for producing a JFET, which can be carried out without the necessity of deep-implantation. To achieve this, the n$^+$-source implantation is performed on the main surface of the substrate. Then, trenches are etched into the drift-area, which define the channel width and the channel height. A subsequent p$^+$-implant creates the structure of FIG. 7B, which is to be further processed, for example, by contacting the source and the gate-areas to arrive at a fully functional device. When a deep-implant does not have to be performed, one saves process time. The deeper you implant, the higher the energy has to be and, due to technical constraints, the lower the dopant flux will be. Therefore, process time can be sped up by only using low-energy implants, preferably without a tilt.

As previously discussed, the embodiment of FIGS. 7A-7C defines a very simple, fast process, thus having the potential of significantly increasing overall production efficiency and decreasing device costs.

Figure 8A:
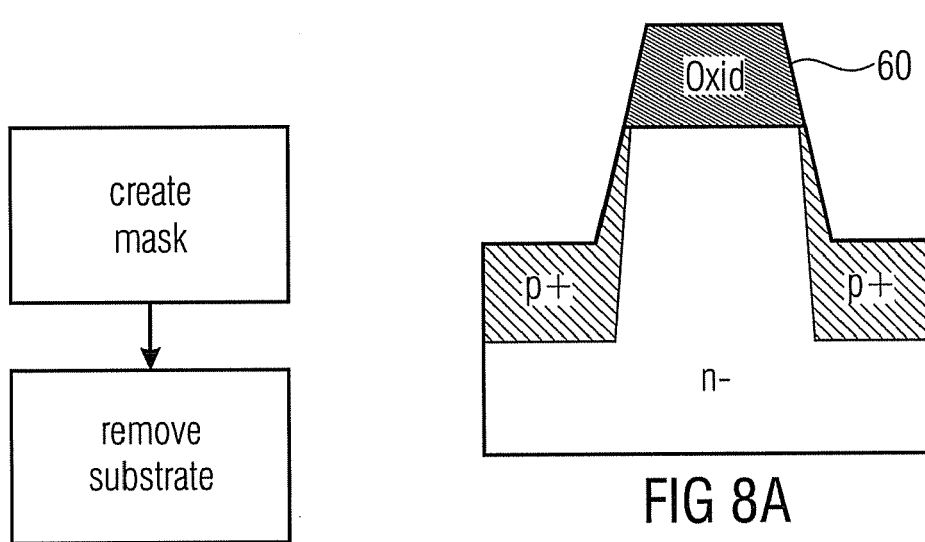
FIGS. 8A-8C illustrate a further embodiment of a method for producing an integrated circuit including a VJFET.
Figure 8B:
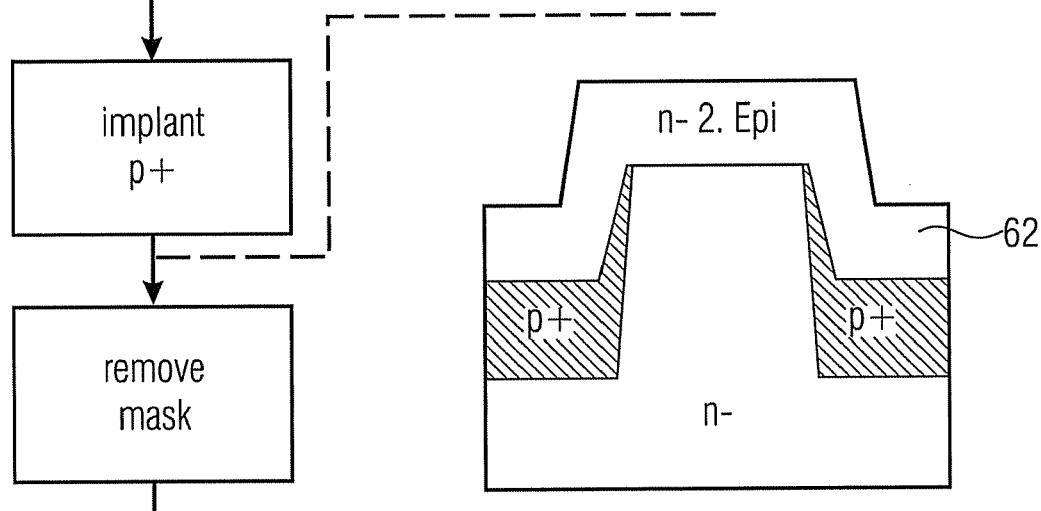
Figure 8C:
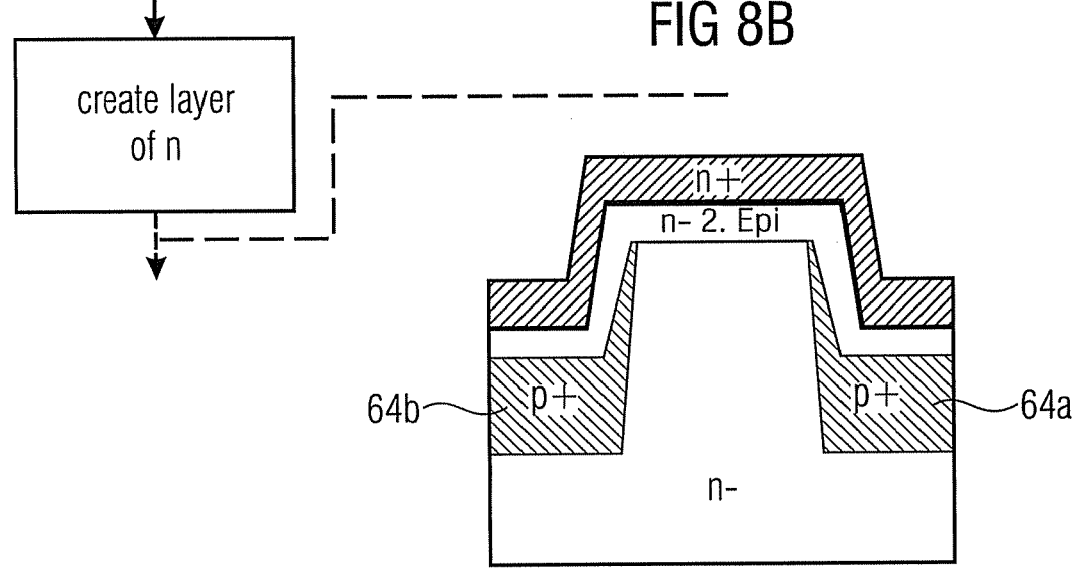

FIGS. 8A-8C illustrate a further embodiment, in which an epitactic n-growth is performed after etching the gate-areas and after implanting the p$^+$-implants on both sides of the mask. Although not illustrated in FIGS. 8A-8C, a subsequent etching and contacting of the source-diode and the gate-areas may be performed to create a functional device.

In particular, the embodiment illustrated in FIGS. 8A-8C implements the following processes. A mask 60 is created with a predetermined width (defining the channel geometry) on a main surface of a semiconductor substrate of a first conductivity type. Then, the substrate is removed on a first and on a second side of the mask up to a predetermined depth. To arrive at the configuration of FIG. 8A, a further implant of a second conductivity type material is performed into the main surface on either side of the mask 60. Then, the mask 60 is removed and a layer of a semiconductor material of the first conductivity type 62 is created on the main surface of the substrate, such as to arrive at the semiconductor arrangement of FIG. 8B.

As furthermore illustrated in FIG. 8C, a high-dose n-implant may be applied such as to arrive at a highly doped n$^+$-top layer, which may be used to efficiently contact the source-region of the device. Again, necessary contact pads and etch processes to reach the buried areas 64a and 64b of the p-implant of the second conductivity type may be performed. The application of the additional epitactically grown layer 62 improves the source-gate blocking capability when using etched structures and therefore also the flexibility in choosing the source-gate voltage of the device. Therefore, using the embodiment illustrated in FIGS. 8A-8C, devices with an extremely high reliability can be produced.

Although not explicitly illustrated in the above illustrations or described in the above production processes, it goes without saying that it is not necessarily the case that the n-dopant in the channel area is constant. To the contrary, it may be desirable to create a predetermined gradient of the dopant concentration within the channel area, to fine-tune the physical properties of the channel and the blocking characteristics of the gate-source diode. A variant n-dopant concentration can, for example, be achieved by varying the energy of the dopant source during doping or by altering the environment parameters during an epitactical growth of an additional n-layer.

According to a further embodiment, the oxide mask for the p-implant or the etching and the p-implant may be structured using a special etching technique allowing for smaller size oxide structures. To achieve this, a layer of amorphous silicon may be deposited on a previously applied oxide of an oxide mask. Both silicon and oxide are structured by lithography and dry-etching. Then, the oxide may be selectively etched away from the area below the silicon using wet-etching techniques. By controlling the environment parameters, the width of the remaining oxide-mask can be controlled precisely and, in particular, be processed to be smaller as possible with photolithographic (dry-etching) techniques. When using oxide masks generated in the previously described manner, the structure sizes can be furthermore decreased, extending the range of possible applications to those which require small channel width.

Although the previously described embodiments are only described in terms of creating a VJFET having an n-channel, it goes without saying that devices having a p-channel can also be created using any of the inventive methods. Therefore, in more general terms, one may understand the n-dopants as dopants of a first conductivity type and the p-dopants as dopants of a second, different conductivity type. Thus, the method can, of course, be used to produce devices having an "inverted" dopant profile that is having a p-dopant where n-dopants have been described previously and vice versa.

Generally, the previously described embodiments provide numerous benefits. First, by saving an additional circuitry element, i.e. an additional diode, costs can be saved, in particular since SiC-substrates are rather expensive and a decrease of the required materials is, therefore, highly appreciated.

Furthermore, in voltage conversion applications, the reliability of the device can be significantly increased. A further advantage is that the robustness with respect to avalanche-breakdowns is significantly increased, since a possible avalanche is created within every single cell in a cell-array (in the $p^+$-anode and therefore in the load circuit), as the radius of curvature, which defines the avalanche-properties, is a design parameter identical within each individual cell.

Although previously illustrated for manufacturing VJFETs, embodiments can furthermore be used to produce numerous other devices, such as for example Bipolar injection FETs (BIFETs). BIFETs include an additional layer of semiconductor material underneath the body area. That is, the body area, which is mostly epitactically grown, is created on top of a substrate, which is of a conductivity type different than the one of the body area. That is, for example, a p-body (driftlayer) is grown on top of an n-substrate or vice versa.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

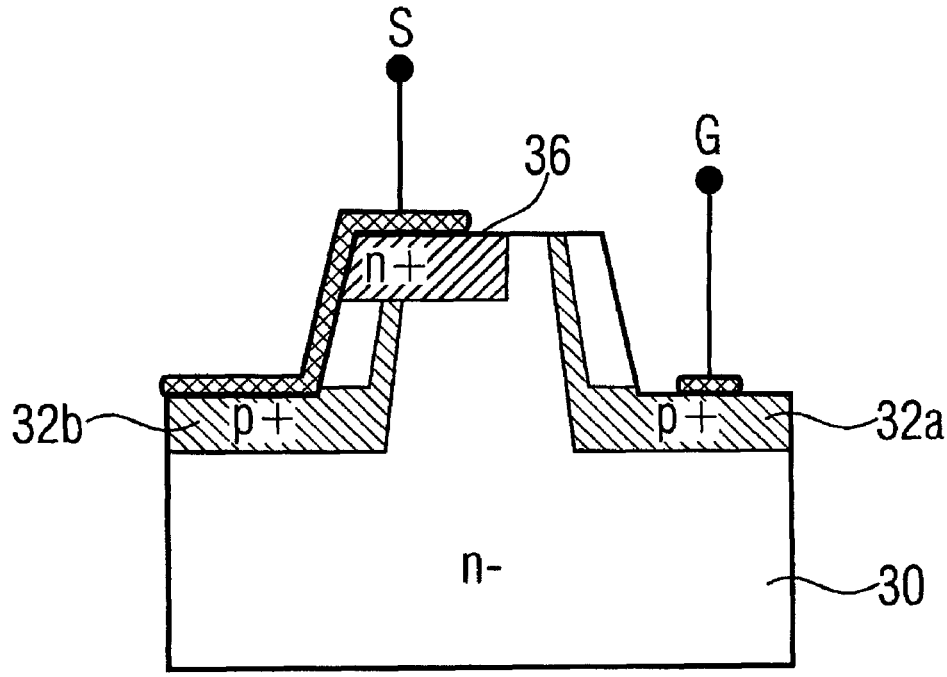

What is claimed is:

1. A method for producing an integrated circuit including a vertical JFET, the method comprising:
   creating a mask on a main surface of a semiconductor substrate having a semiconductor layer of a first conductivity type at the main surface;
   implanting a second conductivity type material into the main surface at a first and a second side of the mask;
   removing the mask;
   creating a source layer of semiconductor material of the first conductivity type on the main surface of the substrate; and
   short-circuiting the second conductivity type material of the first or the second side with the source layer of the first conductivity type;
   wherein the short-circuiting includes removing semiconductor material at the first and/or second side of the mask up to the second conductivity type material, and depositing conductive material on the source layer and on the second conductivity type material at the first or the second side.

2. The method of claim 1, in which creating the source layer comprises implanting a dopant material of the first conductivity type, the method further comprising implanting the semiconductor material of the first conductivity type using at least two different energies such that a dopant concentration is created which has maxima in two different depths.

3. The method of claim 1, in which creating the source layer comprises growing semiconductor material of the first conductivity type on the main surface of the substrate.

4. The method of claim 3, in which creating the source layer additionally comprises:
   implanting a dopant material of the first conductivity type in the main surface.

5. The method of claim 1, in which the implanting of the second conductivity type material is performed such that the second conductivity material extends to the main surface of the substrate on the first and the second sides of the mask.

6. The method of claim 1, comprising creating the source layer of the semiconductor material with a higher dopant concentration than the dopant concentration of the semiconductor layer of the first conductivity type.

7. The method of claim 1, in which the creating of the mask is performed such that the mask has a width, and the implanting is performed such that the second conductivity type material is implanted into the main surface up to a depth, wherein the width is smaller than the depth.

8. The method of claim 1, wherein creating the mask is performed such that the mask has a width, and the implanting is performed such that the second conductivity type material is implanted into the main surface up to a depth,
   wherein the depth is greater than 0.5 µm and smaller than 10 µm and the width of the mask is greater than 0.5 µm and smaller than 8 µm.

9. The method of claim 1, further comprising:
creating a layer of second conductivity type material at a surface of the semiconductor substrate facing away from the main surface.

10. The method of claim 1, wherein creating the mask is performed such that the mask is created on the main surface of a SiC substrate.

11. The method of claim 1, wherein creating the mask is performed such that the mask is a 2 dimensional mask having a width such that the areas on the left side and on the right side of the mask are physically separated from each other in direction of the width.

12. The method of claim 1, in which creating the source layer of semiconductor material comprises:
creating a source mask on the main surface of the semiconductor substrate, the source mask only partly covering the area of the removed mask; and
implanting first conductivity type material into the main surface.

13. A method for producing an integrated circuit including a vertical JFET, the method comprising:
creating a first mask of a first width on a first area of a main surface of a semiconductor substrate having a semiconductor layer of a first conductivity type at the main surface;
implanting a second conductivity type material into the main surface at the first and the second side of the mask;
removing the first mask;
creating a second mask of a second width greater than the first width on a second area of the main surface of the semiconductor substrate, the second area encompassing the first area;
removing the substrate at a first and at a second side of the second mask up to the second conductivity type material;
removing the second mask; and
short-circuiting the second conductivity type material of the first or the second side and the semiconductor material of the first conductivity type at the position of the removed second mask.

14. The method of claim 13, further comprising:
providing the semiconductor substrate with a body portion having a first dopant concentration and with a surface portion extending to the main surface having a second dopant concentration, wherein the second dopant concentration is higher than the first dopant concentration.

* * * * *

UNITED STATES PATENT AND TRADEMARK OFFICE
CERTIFICATE OF CORRECTION

| | | |
|---|---|---|
| PATENT NO. | : 7,763,506 B2 | Page 1 of 1 |
| APPLICATION NO. | : 11/852853 | |
| DATED | : July 27, 2010 | |
| INVENTOR(S) | : Michael Treu et al. | |

It is certified that error appears in the above-identified patent and that said Letters Patent is hereby corrected as shown below:

Column 12, line 23, insert the following

--15. The method of claim 1, in which the removing of the semiconductor material comprises:

creating, at a position of the removed mask, a second mask on the main surface of the substrate; and etching the semiconductor material on a first and/or a second side of the second mask.

16. The method of claim 1, in which creating the source layer comprises implanting a dopant material of the first conductivity type.

17. The method of claim 1, in which the first conductivity type is different than the second conductivity type.--

Column 12, line 23, insert the following

--18. The method of claim 14, in which the providing comprises:

providing the semiconductor substrate with the first dopant concentration of the first conductivity type material; and implanting first conductivity type material in the surface volume of the semiconductor substrate.

19. The method of claim 13, in which a 2 dimensional mask of the predetermined width is created such on the main surface of the substrate that the areas on the left side and on the right side of the mask are physically separated from each other.--

Signed and Sealed this
Twenty-fourth Day of May, 2011

David J. Kappos
*Director of the United States Patent and Trademark Office*

UNITED STATES PATENT AND TRADEMARK OFFICE
CERTIFICATE OF CORRECTION

| | |
|---|---|
| PATENT NO. | : 7,763,506 B2 |
| APPLICATION NO. | : 11/852853 |
| DATED | : July 27, 2010 |
| INVENTOR(S) | : Michael Treu et al. |

It is certified that error appears in the above-identified patent and that said Letters Patent is hereby corrected as shown below:

Delete the title page and substitute therefore the attached title page showing the corrected number of claims in patent.

Column 12, line 23, insert the following

--15. The method of claim 1, in which the removing of the semiconductor material comprises:
creating, at a position of the removed mask, a second mask on the main surface of the substrate; and
etching the semiconductor material on a first and/or a second side of the second mask.

16. The method of claim 1, in which creating the source layer comprises implanting a dopant material of the first conductivity type.

17. The method of claim 1, in which the first conductivity type is different than the second conductivity type.--

This certificate supersedes the Certificate of Correction issued May 24, 2011.

Signed and Sealed this
Twenty-first Day of June, 2011

David J. Kappos
*Director of the United States Patent and Trademark Office*

CERTIFICATE OF CORRECTION (continued)
U.S. Pat. No. 7,763,506 B2

Column 12, line 23, insert the following

--18. The method of claim 14, in which the providing comprises:

providing the semiconductor substrate with the first dopant concentration of the first conductivity type material; and implanting first conductivity type material in the surface volume of the semiconductor substrate.

19. The method of claim 13, in which a 2 dimensional mask of the predetermined width is created such on the main surface of the substrate that the areas on the left side and on the right side of the mask are physically separated from each other.--

CERTIFICATE OF CORRECTION (continued)

(12) United States Patent
Treu et al.

(10) Patent No.: US 7,763,506 B2
(45) Date of Patent: Jul. 27, 2010

(54) METHOD FOR MAKING AN INTEGRATED CIRCUIT INCLUDING VERTICAL JUNCTION FIELD EFFECT TRANSISTORS

(75) Inventors: Michael Treu, Villach (AT); Roland Rupp, Lauf (DE); Heinz Mitlehner, Uttenreuth (DE); Rudolf Elpelt, Erlangen (DE); Peter Friedrichs, Nuremberg (DE); Larissa Wehrhahn-Kilian, Erlangen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 11/852,853

(22) Filed: Sep. 10, 2007

(65) Prior Publication Data
US 2009/0068803 A1   Mar. 12, 2009

(51) Int. Cl.
*H01L 21/337*   (2006.01)
(52) U.S. Cl. ............................. 438/192; 257/E21.447
(58) Field of Classification Search ............... 438/192; 257/E21.447
See application file for complete search history.

(56) References Cited

U.S. PATENT DOCUMENTS

| 5,705,830 | A | 1/1998 | Siergiej et al. |
| 6,693,322 | B2 | 2/2004 | Friedrichs et al. |
| 6,870,189 | B1 * | 3/2005 | Harada et al. ............. 257/77 |
| 2004/0232450 | A1 * | 11/2004 | Yilmaz ....................... 257/213 |
| 2005/0012143 | A1 * | 1/2005 | Tanaka et al. ............. 257/328 |
| 2006/0113593 | A1 | 6/2006 | Sankin et al. |

FOREIGN PATENT DOCUMENTS

| DE | 102005046706 | 7/2007 |
| JP | 2006-190807 | 7/2006 |
| WO | 0209195 | 1/2002 |

* cited by examiner

*Primary Examiner*—Matthew Smith
*Assistant Examiner*—Walter H Swanson
(74) *Attorney, Agent, or Firm*—Dicke, Billig & Czaja, PLLC

(57) ABSTRACT

A method for making an integrated circuit including vertical junction field effect transistors is disclosed. One embodiment creates a vertical junction field effect transistor using a fault-tolerant or alignment-tolerant production process. The device performance is not harmed, even if misalignments in consecutive semiconductor processing steps occur.

19 Claims, 9 Drawing Sheets